US012784835B2

(12) United States Patent
Lin et al.

(10) Patent No.: US 12,784,835 B2
(45) Date of Patent: Nov. 3, 2026

(54) MEMORY DEVICE AND OPERATING METHOD THEREOF

(71) Applicant: TAIWAN SEMICONDUCTOR MANUFACTURING COMPANY, LTD., Hsinchu (TW)

(72) Inventors: Yu-Wei Lin, Taichung City (TW); Meng-Sheng Chang, Hsinchu County (TW); Shao-Yu Chou, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 169 days.

(21) Appl. No.: 18/633,244

(22) Filed: Apr. 11, 2024

(65) Prior Publication Data

US 2025/0322877 A1 Oct. 16, 2025

(51) Int. Cl.
*G11C 16/08* (2006.01)
*G06F 7/501* (2006.01)
(Continued)

(52) U.S. Cl.
CPC .............. *G11C 16/08* (2013.01); *G06F 7/501* (2013.01); *G11C 16/30* (2013.01); *G11C 17/16* (2013.01)

(58) Field of Classification Search
CPC ......... G11C 16/08; G11C 16/30; G11C 17/16; G11C 17/18; G11C 11/54; G11C 13/0028; G06F 7/501
See application file for complete search history.

(56) References Cited

U.S. PATENT DOCUMENTS 7,508,700 B2 * 3/2009 Zhong .................... H10N 50/01 365/158
8,373,363 B2 * 2/2013 Grajcar .................. H05B 45/10 315/318

(Continued)

FOREIGN PATENT DOCUMENTS

TW 202203053 A 1/2022
TW 202240583 A 10/2022

OTHER PUBLICATIONS

Chang et al., "NV-BNN: An Accurate Deep Convolutional Neural Network Based on Binary STT-MRAM for Adaptive AI Edge", 2019 56th ACM/IEEE Design Automation Conference (DAC), 2019, total of 6 pages.

(Continued)

*Primary Examiner* — Sultana Begum
(74) *Attorney, Agent, or Firm* — Birch, Stewart, Kolasch & Birch, LLP

(57) ABSTRACT

A memory device is provided, including a non-volatile memory array including multiple memory cells, in which the memory cells arranged in a same row are configured to store corresponding weight data and are coupled to a same word line in multiple word lines; a word line driver configured to transmit multiple word line signals according to multiple input data signals to the word lines to perform a compute-in-memory (CIM) operation of the input data signals and the weight data stored in the non-volatile memory array; and an adder tree circuit coupled to the memory cells. Each of the memory cells in the same row is configured to generate a corresponding output voltage of the CIM operation to the adder tree circuit.

20 Claims, 15 Drawing Sheets

(51) Int. Cl.
*G11C 16/30* (2006.01)
*G11C 17/16* (2006.01)

(56) References Cited

U.S. PATENT DOCUMENTS

| | | | | | |
|---|---|---|---|---|---|
| 10,644,233 | B2 * | 5/2020 | Lofaro | H10N 50/80 | |
| 11,769,046 | B2 * | 9/2023 | Cohen | H10N 70/8828 | 706/25 |
| 2008/0094884 | A1 * | 4/2008 | Yang | G11C 7/14 | 365/158 |
| 2016/0307910 | A1 * | 10/2016 | Son | H10B 43/40 | |
| 2019/0323456 | A1 * | 10/2019 | Hruza | F02B 29/045 | |
| 2021/0192327 | A1 | 6/2021 | Li et al. | | |

OTHER PUBLICATIONS

Glukhov et al., "Statistical model of program/verify algorithms in resistive-switching memories for in-memory neural network accelerators", 2022 IEEE International Reliability Physics Symposium (IRPS), pp. 3C.3-1-3C.3-7, 2022.
Hou et al., "Reconfigurable and Dynamically Transformable In-Cache-MPUF System With True Randomness Based on the SOT-MRAM", IEEE Transactions on Circuits and Systems I: Regular Papers, vol. 69, No. 7, pp. 2694-2706, Jul. 2022.
Ielmini et al., "Status and challenges of in-memory computing for neural accelerators", 2022 International Symposium on VLSI Technology, Systems and Applications (VLSI-TSA), total of 2 pages, 2022.
Jhang et al., "Challenges and Trends of SRAM-Based Computing-In-Memory for AI Edge Devices", IEEE Transactions on Circuits and Systems I: Regular Papers, vol. 68, No. 5, pp. 1773-1786, May 2021.
Le Gallo et al.,"Compressed Sensing With Approximate Message Passing Using In-Memory Computing", IEEE Transactions on Electron Devices, vol. 65, No. 10, pp. 4304-4312, Oct. 2018.
Trentzsch et al., "A 28nm HKMG super low power embedded NVM technology based on ferroelectric FETs", 2016 IEEE International Electron Devices Meeting (IEDM), pp. 11.5.1-11.5.4, 2016.

* cited by examiner

30

80

MEMORY DEVICE AND OPERATING METHOD THEREOF

BACKGROUND

Precise accuracy holds paramount significance in the execution of compute-in-memory (CIM) operations. However, certain methodologies face constraints in accuracy due to limitations imposed by the resolution of the data converter and signal deterioration during analog accumulation within the CIM memory device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
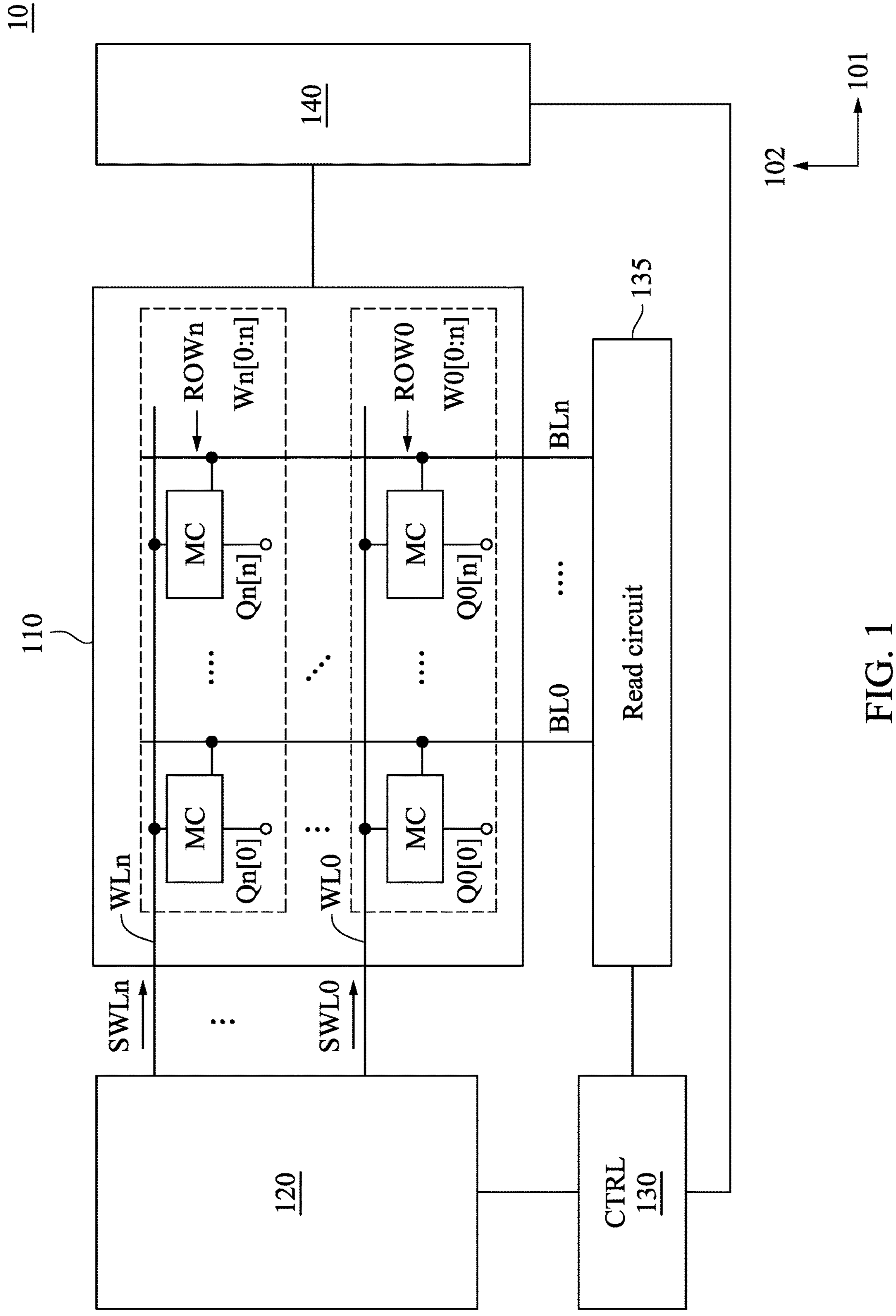
FIG. 1 is a schematic diagram of a memory device in accordance with some embodiments of the present disclosure.

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. The term mask, photolithographic mask, photomask and reticle are used to refer to the same item.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

High accuracy is critically required in a compute-in-memory (CIM) operation. However, in some approaches, accuracy is limited by the data converter resolution and signal degradation in the analog accumulation in the CIM memory device. For example, memory cells storing the weight data in a same column are coupled a same bit line and generate a corresponding CIM result of input data and weight analogly by discharge or charge sharing on the bit line in response to input data. It is vulnerable to noise signals and the sampling range of the accumulation operation is restricted to the range of supply voltage applied on the bit line. Moreover, implementing the memory cells with memory having small ratio of resistances, corresponding to different stored logic data, provides the CIM result of narrowed range, which influences the accuracy of the CIM operation as well.

Compared with the approaches, the present application digitalizes the CIM result of input data and weight by each of memory cells generating individual output voltage, indicating a logic value of the CIM result, to an adder tree circuit and/or shifter for generating a CIM result of all input data and weight data. Specifically, the CIM device includes non-volatile memory that has large ratio of resistances corresponding to different stored logic data, facilitating the accuracy of the CIM operation. In operation, proposed bias circuits generate word line signals in response to input data to word lines coupled to memory cells arranged in rows. A current mirror formed by a transistor in one bias circuit and a transistor in one memory cell replicates a first current from the bias circuit to the memory cell. A voltage across a memory unit in the memory cell through which the second current replicated from the first current flows is associated with the resistance of the memory unit. Accordingly, an output voltage indicating the CIM result of the memory cell is generated by sensing a voltage difference between the voltage across the memory unit and a reference voltage in the memory cell. Because the high and low resistances of the memory unit are significantly different from each other, e.g., ratio therebetween being greater than at least $10^5$, the output voltage can have a first voltage value around 1 Volt in response to the CIM result having a first bit value (e.g., "0") and a second voltage value around 0 Volts in response to the CIM result having a second bit value (e.g., "1"). With the configurations above, the digitalized CIM result is provided, without accuracy loss and signal margin limitation of the analog accumulation.

Reference is now made to FIG. 1. FIG. 1 is a schematic diagram of a memory device 10 in accordance with some embodiments of the present disclosure. In some embodiments, the memory device 10 is configured as a compute-in-memory system (CIM) for neural network operations. For illustration, the memory device 10 includes a memory array 110, a word line driver 120, a control circuit 130, a read circuit 135, and an adder tree circuit 140. In some embodiments, the control circuit 130 operationally controls the word line driver 120, the read circuit 135, and the adder tree circuit 140 to perform either traditional memory access (e.g., read and write of specific addresses), as well as CIM operation. In some embodiments, the control circuit 130 includes an x-decoder for the word lines and a y-decoder for the bit lines and/or sensing lines. It also contains timing control for read, write, and computation operations.

For illustration, the memory array 110 is coupled to the word line driver 120 through word lines WL0-WLn and coupled to the read circuit 135 through data lines (also referred to as bit lines) BL0-BLn. The memory array 110 is further coupled to the adder tree circuit 140. In some embodiments, the word lines WL0-WLn extend in a row direction 101. The data lines BL0-BLn extend in a column direction 102 different from the row direction 101.

The memory array 110 includes memory cells MC. The memory cells MC are at the intersection of a row with a column in the 110. As illustratively shown in FIG. 1, the memory cells MC arranged in a same row (e.g., the row ROW0) are coupled to a same word line (e.g., WL0) in the word lines WL0-WLn. In some embodiments, each of the memory cells MC is coupled to the adder tree circuit 140 through a corresponding output terminal (e.g., Q0[0]), in which the output terminals are isolated from each other.

In some embodiments, the memory array 110 can be non-volatile memory array. For example, the memory cells MC are operable so as to store a bit, i.e., "1" or "0", of data therein. In some embodiments, each of the memory cells MC include an electrical fuse (eFuse) unit that uses a narrow strip commonly called a "fuse link" of conducting material (e.g., metal, poly-silicon, etc.) between two pads, generally referred to as anode and cathode. When a programing current is applied to the eFuse and destroys the (i.e., fuses) the link, the resistivity of the eFuse changes to a programmed state and have a high resistance (e.g., Rprogrammed). Accordingly, a bit, e.g., "1" is stored in the memory cell MC. Otherwise, i.e., when the eFuse is left intact or un-programmed, a bit, e.g., "0", is stored in the memory cell MC according to a low resistance (e.g., Run-programmed). One-time-programmable (OTP) memory is one type of non-volatile memory that can be programmed once to have different resistance to store information that is not to be subsequently changed. The resistivity of eFuse (i.e., whether it has been programmed) and the OTP memory can be read by the read circuit 135, so that the stored data is read. In some embodiments, a ratio between the high resistance Rprogrammed over the low resistance Runprogrammed of the memory cells MC of FIG. 1 is at least over $10^5$.

In some embodiments, the memory array 110 is configured to store multiple weights W0-Wn accessed for the neural network. For example, as shown in FIG. 1, n bits of weight data W0-Wn are stored in corresponding rows ROW0-ROWn, in which each bit in the weight data stored in a certain memory cell in a row.

The word line driver (WLDR) 120 is coupled to rows of memory cells MC in the memory array 110 through word lines WL0-WLn, and is configured to generate word line signals SWL0-SWLN to drive the word lines WL0-WLn for accessing the memory array 110 to read/write bits from/into the memory array 110 in response to control signal associated with addresses, in which the addresses indicate some specific memory cells, storing bits, in the memory array 110. Specifically, in some embodiments, the word line driver 120 selects and activates the specific memory cells in the memory array 110 according to the addresses.

In some embodiments, when a CIM operation is performed, the word line driver 120 receives a number n of binary input data X0-Xn and generates corresponding word line signals SWL0-SWLn to the memory array 110. For example, in some embodiments, the word line driver 120 generates the word line signal SWL0 having a first voltage in response to an (n+1)-th bit X0[n] of the input data X0 having a first bit value, for example, "1". Then, each of the memory cells MC coupled to the word line WL0 generates an output signal at an output terminal (e.g., one of the output terminals Q0[0]-Qn[n]) thereof according to a weight bit store therein and the word line signal SWL0.

For example, a voltage of the output terminal Q0[0] of the memory cell MC corresponds to an output voltage of the CIM operation of the (n+1)-th bit X0[n] and the first bit W0[0] of the weight data W0. A voltage of the output terminal Q0[n] of the memory cell MC corresponds to an output voltage of the CIM operation of the (n+1)-th bit X0[n] and the (n+1)-th bit W0[n] of the weight data W0, and so on.

The adder tree circuit 140 is further configured to perform an addition operation to all the output voltages from each of the memory cells MC to generate a result of the CIM operation. The detail operational configurations of the memory device 10 in the CIM operation will be discussed with reference to FIGS. 2-9.

In some embodiments, the read circuit 135 can include a bit line multiplexer (MUX), a bit line pre-charging circuit, and an input/output (IO) circuit. In some embodiments, the bit line multiplexer is configured to enable columns of the memory array 110 by selecting the bit line based on the control signal from the control circuit 130. The bit line pre-charging circuit pre-charges the bit lines for read operations. The IO circuit is configured to transmit data to readout data stored in the memory array 110. For example, the input/output circuit outputs read out signal of the memory cell MC from the memory array 110. In some embodiments, the IO circuit includes sensing circuit configured to generate a read data based on the read out signal.

Figure 2:
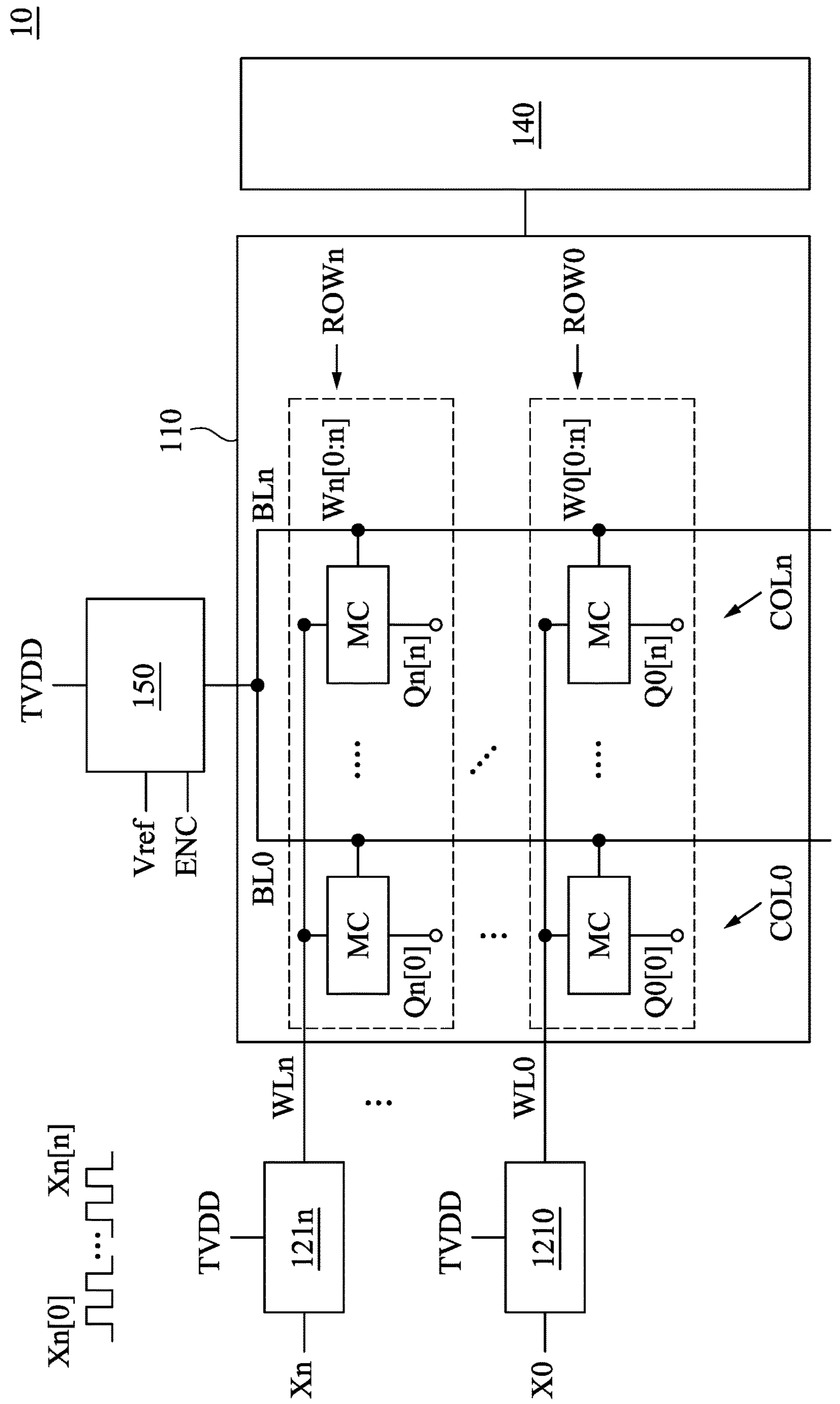
FIG. 2 is a schematic diagram of a memory device corresponding to the memory device shown in FIG. 1, in accordance with some embodiments of the present disclosure.

Reference is now made to FIG. 2. FIG. 2 is a schematic diagram of the memory device corresponding to the memory device shown in FIG. 1, in accordance with some embodiments of the present disclosure. With respect to the embodiments of FIG. 1, like elements in FIG. 2 are designated with the same reference numbers for ease of understanding. The specific operations of similar elements, which are already discussed in detail in above paragraphs, are omitted herein for the sake of brevity.

As illustratively shown in FIG. 2, the word line driver 120 includes bias circuits 1210-121*n* that are coupled to a voltage terminal TVDD providing a supply voltage VDD. In some embodiments, each of the bias circuits 1210-121*n* are configured to generate one of the word line signals SWL0-SWLn based on a corresponding input data in the input data X0-Xn to the word lines WL0-WL0.

Furthermore, the memory device 10 includes a voltage generating circuit 150. For illustration, the voltage generating circuit 150 is coupled between the voltage terminal TVDD and the memory array 110. In some embodiments, the voltage generating circuit 150 is configured to operate in response to the reference voltage Vref and a control signal ENC to transmit a voltage VBL to the bit lines BL0-BLn. In some embodiments, the voltage VBL is referred to as a data line voltage. As shown in the embodiments of FIG. 2, the bit lines BL0-BLn are coupled together at an output terminal of the voltage generating circuit 150. In some embodiments, the voltage generating circuit 150 is further configured to generate the voltage VBL to have a certain voltage value according to the reference voltage Vref in the CIM operation.

Figure 3:
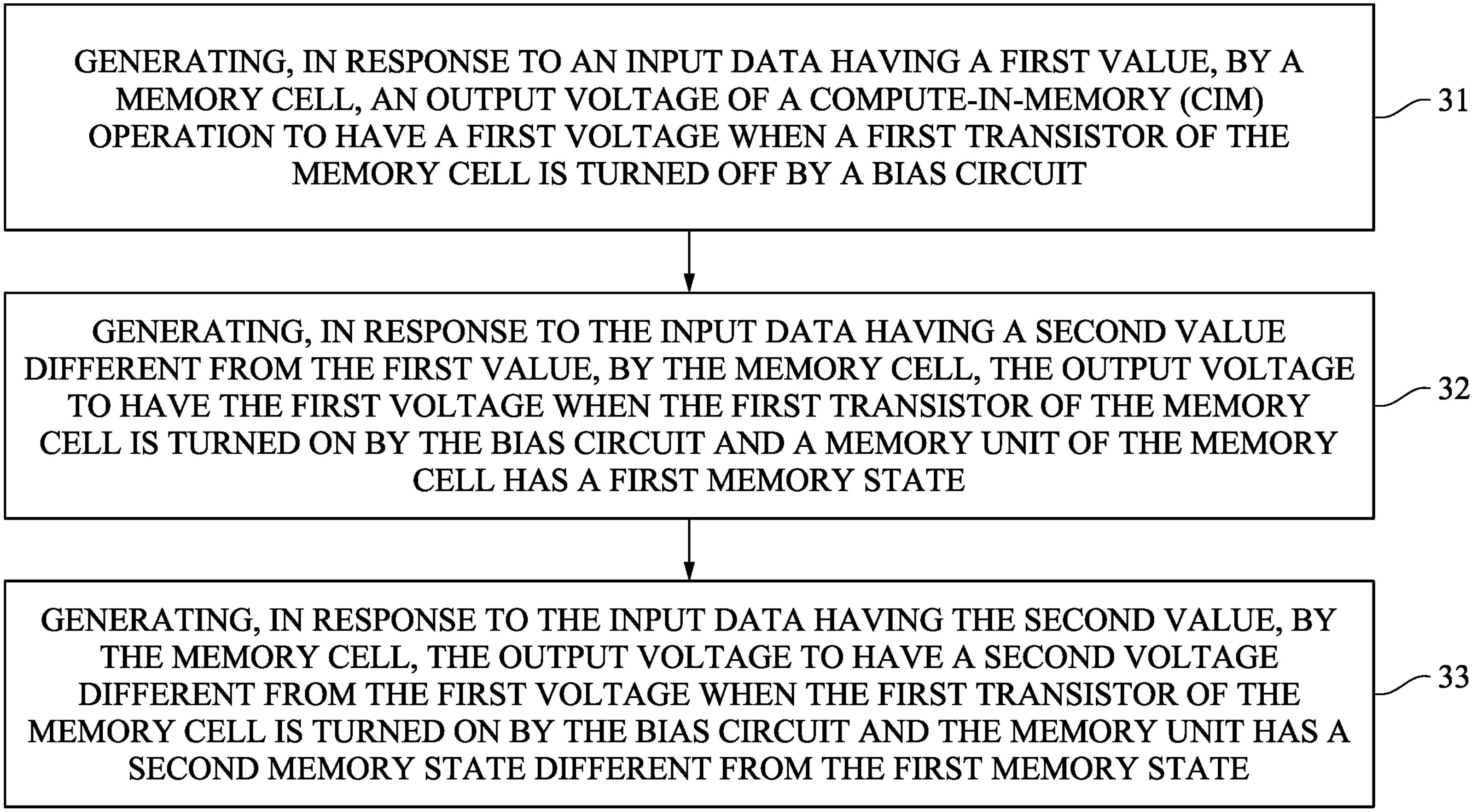
FIG. 3 is a flowchart diagram of a method for operating a memory device, in accordance with some embodiments of the present disclosure.

Reference is now made to FIG. 3. FIG. 3 is a flowchart diagram of a method 30 for operating a memory device corresponding to, for example, the memory device 10 of FIGS. 1-2, a memory device 40 of FIG. 4, a memory device 60 of FIG. 6, a memory device 80 of FIG. 8, or a memory device 90 of FIG. 9, in accordance with some embodiments of the present disclosure. It is understood that additional operations can be provided before, during, and after the processes shown by FIG. 3, and some of the operations described below can be replaced or eliminated, for additional embodiments of the method 30. The order of the operations/processes may be interchangeable. Throughout the various views and illustrative embodiments, like reference numbers are used to designate like elements. The method 30 includes operations 31-33 that are described below with reference to the memory devices 40 and 60 corresponding to FIGS. 4-7D.

Figure 4:
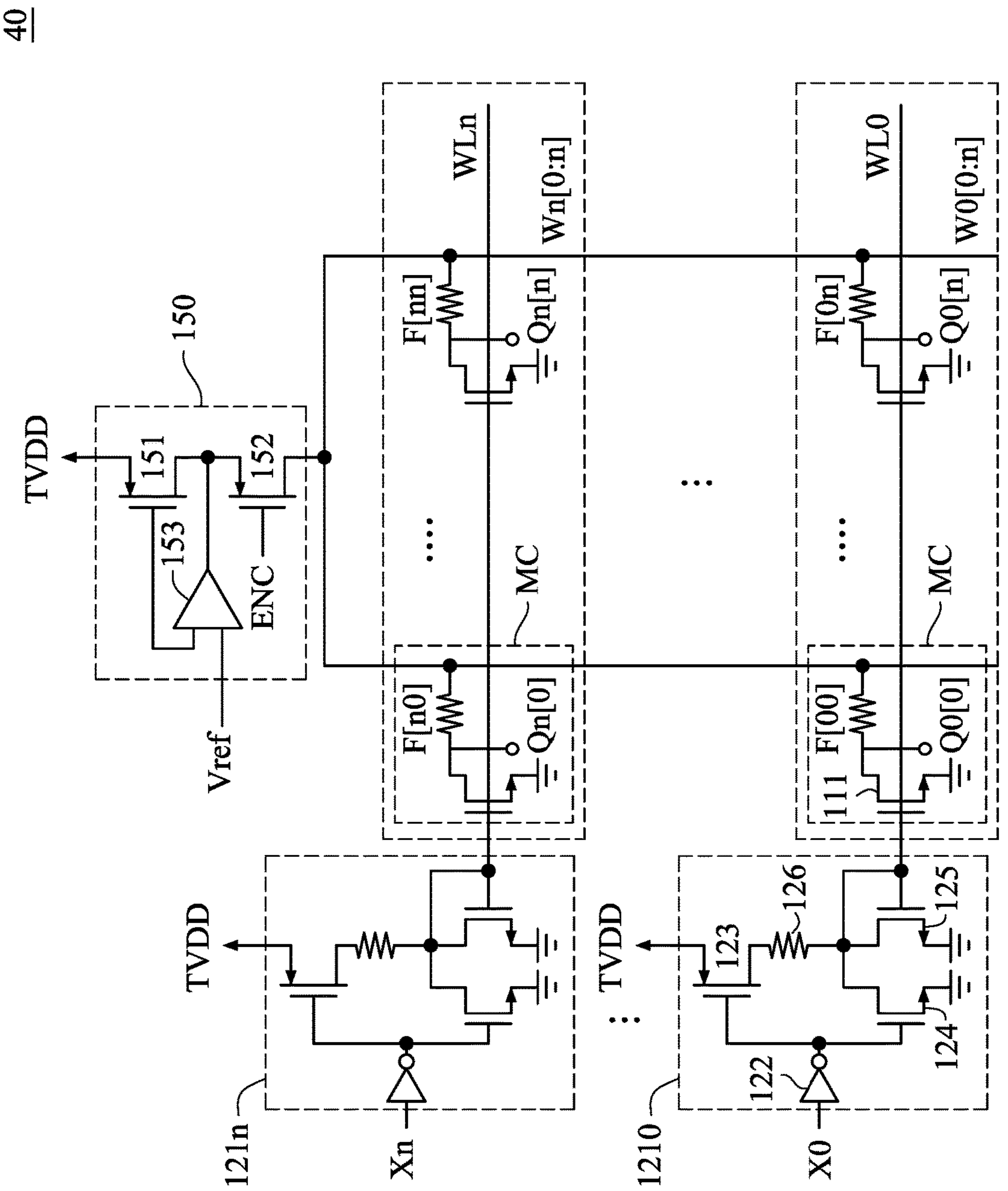
FIG. 4 is a schematic diagram of a memory device, in accordance with some embodiments of the present disclosure.

Reference is now made to FIG. 4. FIG. 4 is a schematic diagram of a memory device 40, in accordance with some embodiments of the present disclosure. In some embodiments, the memory device 40 is configured with respect to, for example, the memory device 10 of FIGS. 1-2. With respect to the embodiments of FIGS. 1-3, like elements in FIG. 4 are designated with the same reference numbers for ease of understanding. In some embodiments, the memory device 40 is configured with respect to, for example, the memory device 10 of FIG. 2.

As illustratively shown in FIG. 4, each of the bias circuits 1210 to 121*n* includes an inverter 122, transistors 123-125, and a resistive unit 126. Taking the bias circuit 1210 as example, the inverter 122 has an input terminal configured to receive the input data X0 and an output terminal coupled to control terminals (e.g., gate terminals) of the transistors 123 and 124. A source/drain terminal of the transistor 123 is coupled to the voltage terminal TVDD, and a drain/source terminal of the transistor 123 is coupled to a first terminal of the resistive unit 126. A second terminal of the resistive unit 126 is coupled to drain/source terminals of the transistors 124 and 125 and the word line WL0. Source/drain terminals of the transistors 124 and 125 are coupled to a ground potential.

In some embodiments, the transistor 123 is a P-type transistor. The transistors 124 and 125 are N-type transistors. The resistive unit 126 is implemented by a resistor. In some embodiments, a resistance of the resistive unit 126 is associated with the high resistance (e.g., Rprogrammed) of a memory unit (e.g., a fuse of FIG. 4 and an OTP unit of FIG. 6) in the memory cell MC. In some embodiments, the resistance of the resistive unit 126 equals to the high resistance Rprogrammed.

For illustration, the voltage generating circuit 150 includes transistors 151 and 152, and an operational amplifier 153. The transistors 151 and 152 are coupled in series between the voltage terminal TVDD and the memory array 110. A first input terminal of the operational amplifier 153 is coupled to a control terminal of the transistor 151. A second input terminal of the operational amplifier 153 is configured to receive the reference voltage Vref. An output terminal of the operational amplifier 153 is coupled between the transistors 151 and 152. A control terminal of the transistor 152 is configured to receive the control signal ENC. In some embodiments, the transistors 151 and 152 are P-type transistors.

In some embodiments, during the CIM operation of the memory device 40, the transistor 152 is configured to be turned on in response to the control signal ENC having a low logic state. The voltage across the gate and drain/source terminals of the transistor 151 is controlled by the operational amplifier 153 in response to the reference voltage Vref. Accordingly, the voltage generating circuit 150 generates, in response to the Vref, the voltage VBL according to the supply voltage provided by the voltage terminal TVDD. In some embodiment, the voltage VBL equals to the supply voltage VDD. In various embodiments, the voltage VBL is less than the supply voltage VDD.

As shown in the embodiments of FIG. 4, the memory cell MC is implemented by the fuse memory and includes a transistor 111 coupled to a memory unit, for example, a fuse. For instance, the memory cells MC storing the weight data W0[0:n] include fuses F[00]-F[0n] configured to have a memory state (e.g., a state of a high resistance or a low resistance) indicating a bit value of the first bit value to the (n+1)-th bit value of the weight data W0[0:n].

For illustration, control terminals of the transistors 111 in the same row are coupled to a same corresponding word line. A source/drain terminal of the transistor 111 is grounded, and a drain/source terminal of the transistor 111 is coupled to a first terminal of the fuse at the output terminal of the memory cell MC. A second terminal of the fuse is coupled to a corresponding bit line. For example, the fuses F[00]-F[0n] are coupled to the bit line BL0.

Reference is now made to FIGS. 5A-5D. FIGS. 5A-5D are schematic diagrams of the memory device 40 corresponding to FIG. 4 in the CIM operation, in accordance with some embodiments of the present disclosure. In some embodiments, FIGS. 5A-5D illustrate four cases in the CIM operation of the memory device 40 separately, as shown in Table I below:

TABLE I

| case | Logic value of input X | Logic value of stored weight in memory cell MC | Logic value of the output Q |
|---|---|---|---|
| A | 0 | 0 | 0 |
| B | 0 | 1 | 0 |
| C | 1 | 0 | 0 |
| D | 1 | 1 | 1 |

In some embodiments, a voltage VQ at the output terminal of the memory cell MC is represented by equation (1):

$$VQ = VBL - Ifuse \times Rfuse \quad (1)$$

in which VBL corresponds to a voltage on the bit line BL coupled to the memory cell MC, Ifuse corresponds to a current flowing from the bit line to the ground terminal via the transistor 111, and Rfuse corresponds to a resistance of the fuse.

Figure 5A:
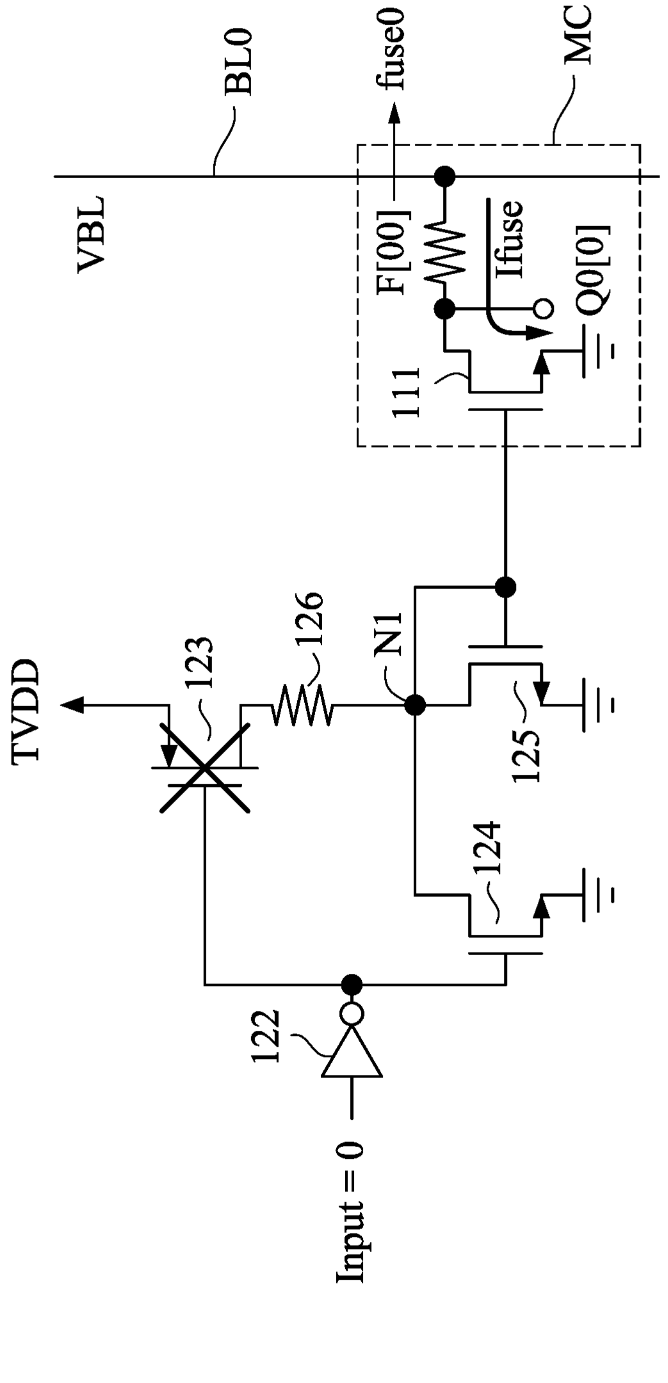
FIGS. 5A-5D are schematic diagrams of the memory device corresponding to FIG. 4 in a compute-in-memory (CIM) operation, in accordance with some embodiments of the present disclosure.

Reference is now made to FIGS. 3-5A together. Taking one of the memory cell MC coupled to the bias circuit 1210 as an example, as shown in FIG. 5A corresponding to case A in Table I, the input data X0 has the logic value "0" and the fuse F[00] has a memory state fuse0 of the low resistance Runprogrammed, for example, around 100Ω. In some embodiments, the memory state fuse0 refers to that the fuse F[00] stores a bit value of "0."

In operation 31, the inverter 122 inverts the input data X having the value "0" to generate an output having a high logic state to the transistors 123 and 124. The P-type transistor 123 is turned off correspondingly to disconnect the node N1 from the voltage terminal TVDD. The N-type transistor 124 is turned on in response to the output of the inverter 122 and discharges the node N1 to a ground potential. The transistors 125 and 111 are turned off in response to the received ground potential at the control terminals thereof through the node N1. As the transistor 111 does not conduct, the current Ifuse equals to 0 Ampere (A) and a value of the voltage VQ is around a voltage V1 represented as below according to equation (1):

$$VQ = VBL - 0 \times 100 = 1 - 0 = 1$$

in which the voltage VBL is around 1 Volt and the voltage VQ is around 1 Volt. In some embodiments, the voltage VQ is around the voltage V1, which can be referred to that the result of the CIM operation equals to the bit value of "0."

Figure 5B:
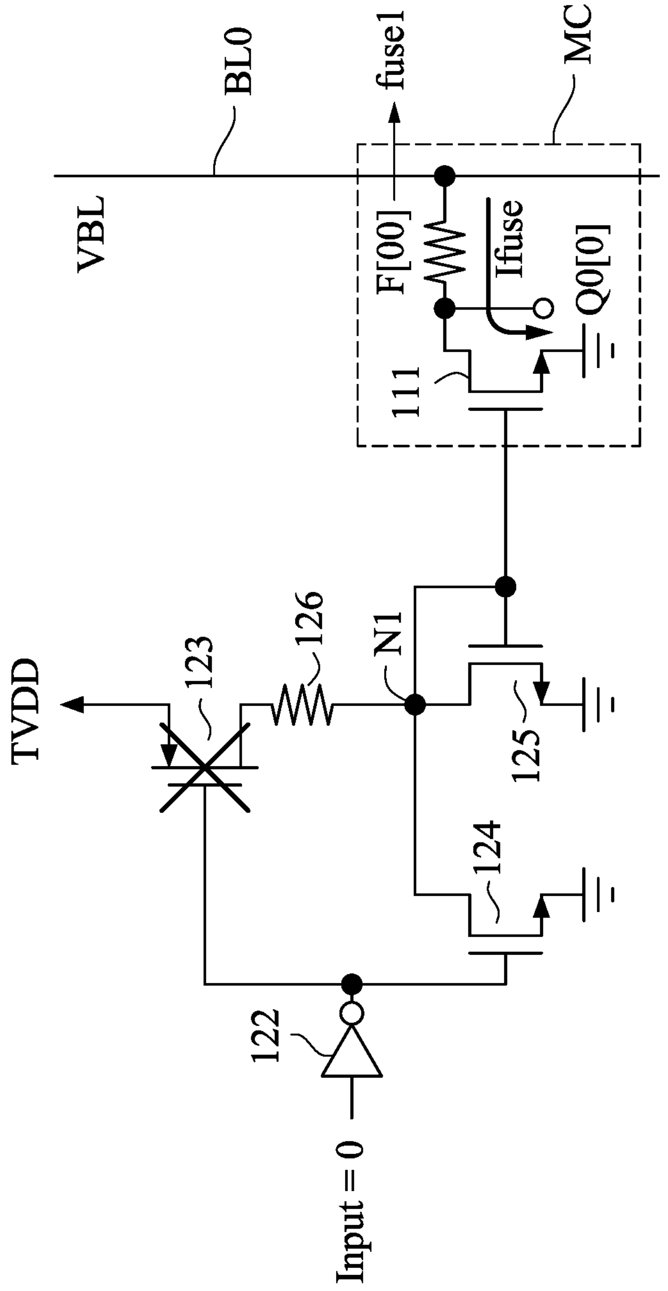

Reference is now made to FIGS. 3-4 and 5B together. As shown in FIG. 5B corresponding to case B in Table I, the input data X0 has the logic value "0" and the fuse F[00] has a memory state fusel of the high resistance Rprogrammed, for example, around 100 kΩ. In some embodiments, the memory state fusel refers to that the fuse F[00] stores a bit value of "1."

In operation 31, it is similar to the configurations of the embodiments in FIG. 5A that the input data X having the value "0" to turn off the transistors 123 and 111 and to turn on the transistors 124 and 125. Hence, the repetitious descriptions are omitted here. As the transistor 111 does not conduct, the current Ifuse equals to 0 Ampere (A) and a value of the voltage VQ is around a voltage V1 represented as below according to equation (1):

$$VQ = VBL - 0 \times 100000 = 1 - 0 = 1$$

in which the voltage VBL is around 1 Volt and the voltage VQ is around 1 Volt. In some embodiments, the voltage VQ is around the voltage V1, which can be referred to that the result of the CIM operation equals to the bit value of "0."

Figure 5C:
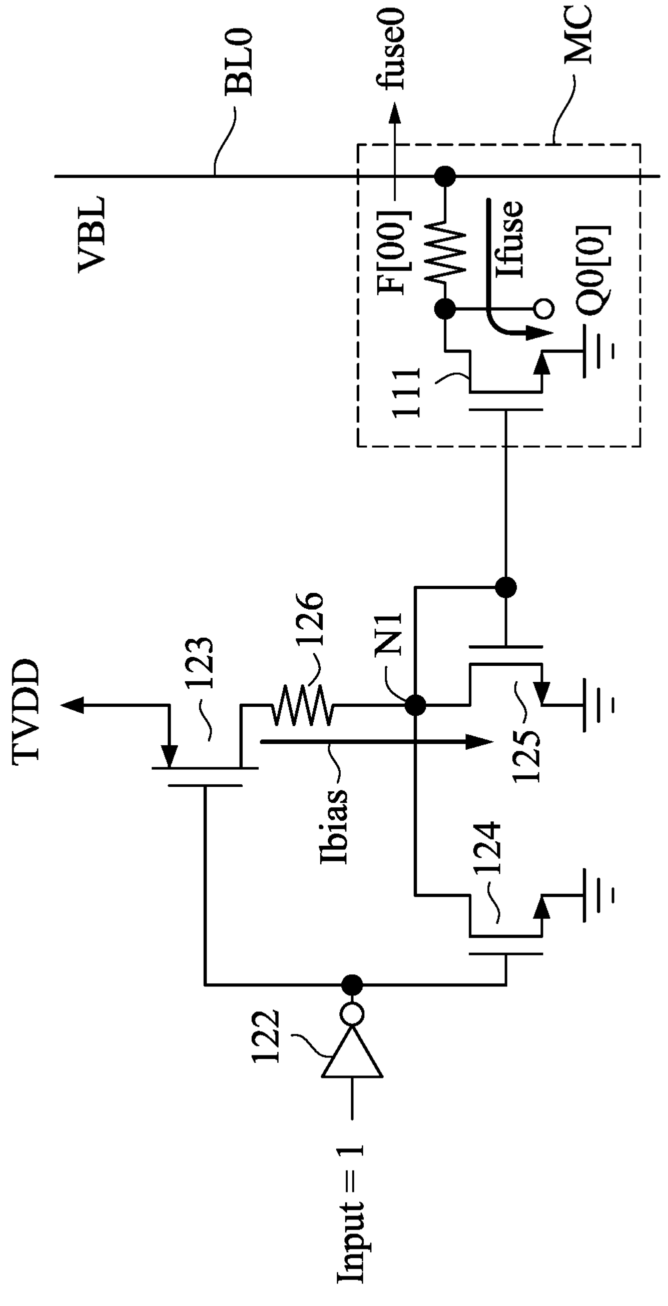

Reference is now made to FIGS. 3-4 and 5C together. As shown in FIG. 5C corresponding to case C in Table I, the input data X0 has the logic value "1" and the fuse F[00] has a memory state fuse0 of the low resistance Runprogrammed corresponding to the bit value of "0."

In operation 32 of FIG. 3, the inverter 122 inverts the input data X having the value "1" to generate an output having a low logic state to the transistors 123 and 124. The P-type transistor 123 and the N-type transistors 124-125 are turned on to generate a current Ibias flowing through the transistors 123-125, the node N1, and the resistive unit 126. Moreover, the transistor 125 in the bias circuit 121 and the transistor 111 form a current mirror. Accordingly, the transistor 111 is turned on in response to the voltage at the node N1 and the current Ifuse, equal to the current Ibias, flows from the bit line BL0 to the ground through the fuse F[00] and the transistor 111. Alternatively stated, the current mirror of the transistors 111 and 125 generates the current Ifuse that flows through the transistor 111 and is replicated from the current Ibias flowing through the transistor 125. As the transistor 111 conducts, the current Ifuse is still relatively small and around 10 uA. The value of the voltage VQ remains around the voltage V1 represented as below according to equation (1):

$$VQ = VBL - Ifuse \times Rfuse = VBL - Ibias \times Rfuse = VBL - 10u \times 100 = 1 - 10u \times 100 \cong 1$$

in which the voltage VBL is around 1 Volt and the voltage VQ is around 1 Volt. In some embodiments, the result of the CIM operation in case C equals to the bit value of "0."

Figure 5D:
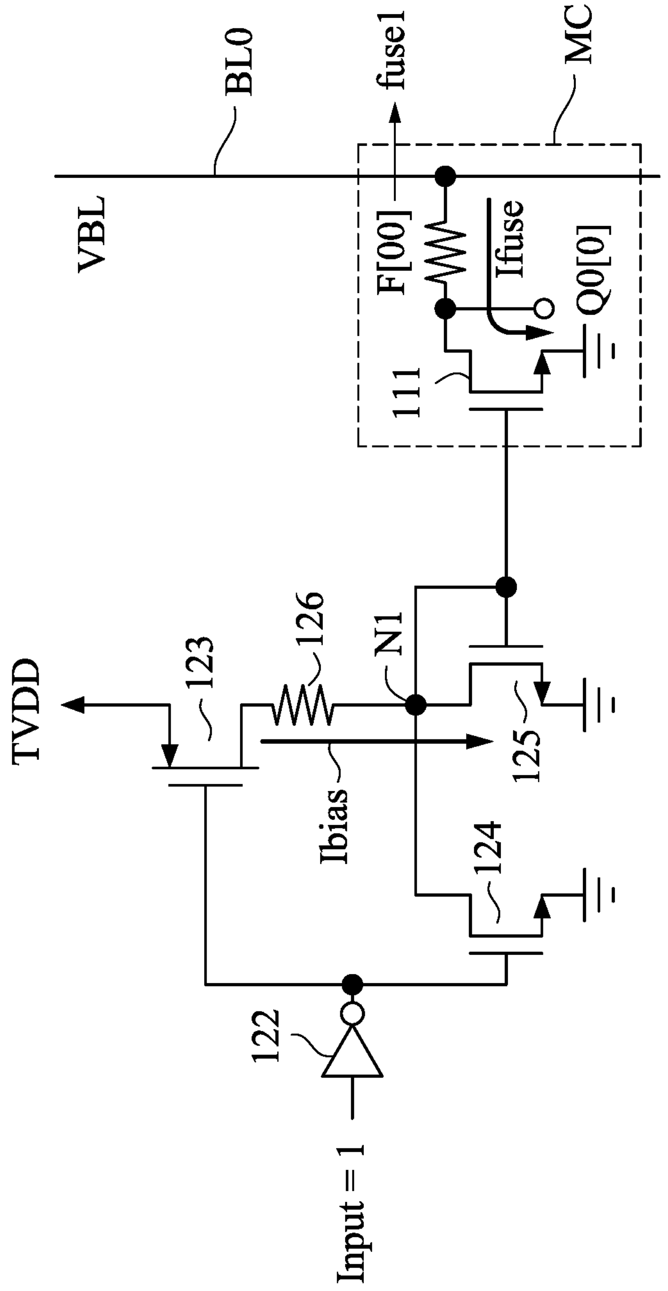

Reference is now made to FIGS. 3-4 and 5D together. As shown in FIG. 5D corresponding to case D in Table I, the input data X0 has the logic value "1" and the fuse F[00] has the memory state fusel of the high resistance Rprogrammed corresponding to the bit value of "1."

In operation 33 of FIG. 3, the inverter 122 inverts the input data X having the value "1" to generate an output having the low logic state to the transistors 123 and 124. The P-type transistor 123, the N-type transistors 124-125 and 111 are turned on to generate the currents Ibias and Ifuse. The value of the voltage VQ is around a voltage V2 different from the voltage V1 and represented as below according to equation (1):

$$VQ = VBL - Ifuse \times Rfuse = VBL - Ibias \times Rfuse = VBL - 10u \times 100000 = 1 - 10u \times 100000 \cong 0$$

in which the voltage VBL is around 1 Volt and the voltage VQ is around 0 Volts. In some embodiments, the voltage VQ is around the voltage V2, which can be referred to that the result of the CIM operation equals to the bit value of "1."

The configurations of FIGS. 4-5D are given for illustrative purposes. Various implements are within the contemplated scope of the present disclosure. For example, in some embodiments, the resistance Rfuse can be suitable value so that the voltage VQ has distinguishably different voltages for different results of the CIM operation (as shown in table I and equation (1)).

Figure 6:
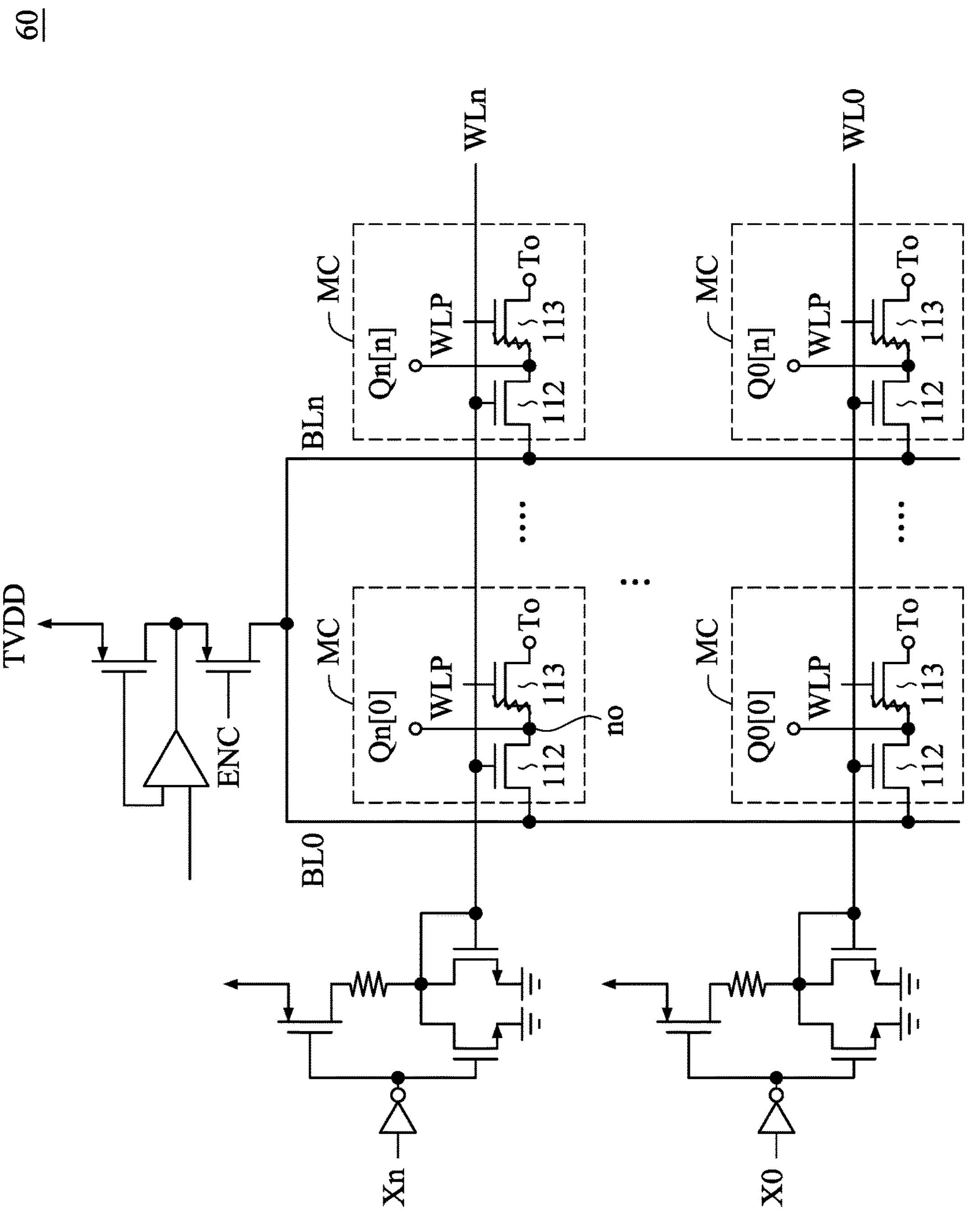
FIG. 6 is a schematic diagram of a memory device, in accordance with some embodiments of the present disclosure.

Reference is now made to FIG. 6. FIG. 6 is a schematic diagram of a memory device 60, in accordance with some embodiments of the present disclosure. With respect to the embodiments of FIGS. 1-5D, like elements in FIG. 6 are designated with the same reference numbers for ease of understanding. In some embodiments, the memory device 60 is configured with respect to, for example, the memory device 10 of FIG. 2.

The memory cell MC in the memory device 60 is implemented by one-time-programmable (OTP) memory, and includes transistors 112-113. For illustration, the transistor 112 is coupled to the transistor 113 that is configured as a memory unit. Specifically, the control terminals of the transistors 112 in a same row are coupled to a same word line. Source/drain terminals of the transistors 112 in a same column are coupled to a same bit line. In some embodiments, of the CIM operation, the bit lines BL0-BLn have the ground potential. A drain/source terminal of the transistor 112 is coupled to a terminal of the transistor 113 in the same memory cell MC. Another terminal of the transistor 113, coupled to node To, is floating, according to some embodiments. In some embodiments of the CIM operation, the control terminal of the transistor 113 is coupled to a word line WLP having a voltage (e.g., a word line voltage) VWLP. In some embodiments, the voltage VWLP equals to the supply voltage VDD. The configurations of FIG. 6 are similar to FIGS. 2 and 4. Hence, the repetitious descriptions are omitted here.

Reference is now made to FIGS. 7A-7D. FIGS. 7A-7D are schematic diagrams of the memory device 60 corresponding to FIG. 6 in the CIM operation, in accordance with some embodiments of the present disclosure. In some embodiments, FIGS. 7A-7D illustrate four cases in the CIM operation of the memory device 60 separately, as shown in the aforementioned Table I.

In some embodiments, a voltage VQ at the output terminal of the memory cell MC is represented by equation (2):

$$VQ = VWLP - IOTP \times ROTP \tag{2}$$

in which VWLP corresponds to a voltage at the control terminal of the transistor 113, current IOTP corresponds to a current flowing between the transistor 113 and the ground terminal via the transistor 112, and resistance ROTP corresponds to a resistance of the transistor 113 as the memory unit.

Figure 7A:
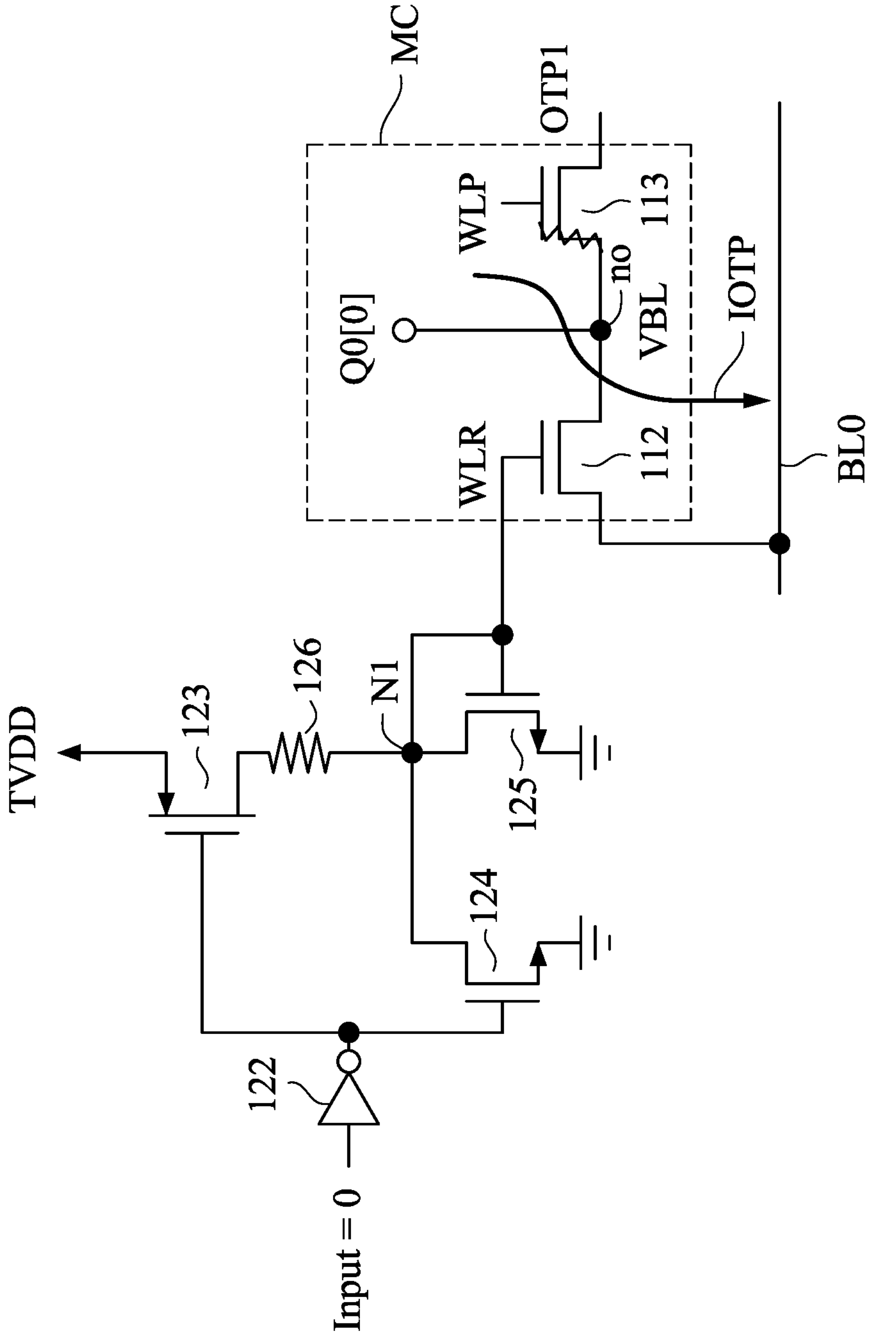
FIGS. 7A-7D are schematic diagrams of the memory device corresponding to FIG. 6 in a compute-in-memory (CIM) operation, in accordance with some embodiments of the present disclosure.

Reference is now made to FIGS. 3 and 6-7A together. Taking one of the memory cell MC coupled to the bias circuit 1210 as an example, as shown in FIG. 7A corresponding to case A in Table I, the input data X0 has the logic value "0" and the transistor 113 has a memory state OTP1 of the low resistance Runprogrammed, for example, around 5KΩ. In some embodiments, the memory state OTP1 refers to that the transistor 113 stores a bit value of "0."

In operation 31, the configurations of the bias circuit 1210 in FIG. 7A are similar to that in FIG. 5A. Hence, the repetitious descriptions are omitted here.

As the transistor 112 does not conduct in response to the ground potential at the node N1, the current IOTP equals to 0 A and a value of the voltage VQ is around the voltage V1 represented as below according to equation (1):

$$VQ = VWLP - 0 \times 5 \times 1000 = 1 - 0 = 1$$

in which the voltage VWLP is around 1 Volt and the voltage VQ is around 1 Volt. In some embodiments, the voltage VQ is around the voltage V1, which can be referred to that the result of the CIM operation equals to the bit value of "0."

Figure 7B:
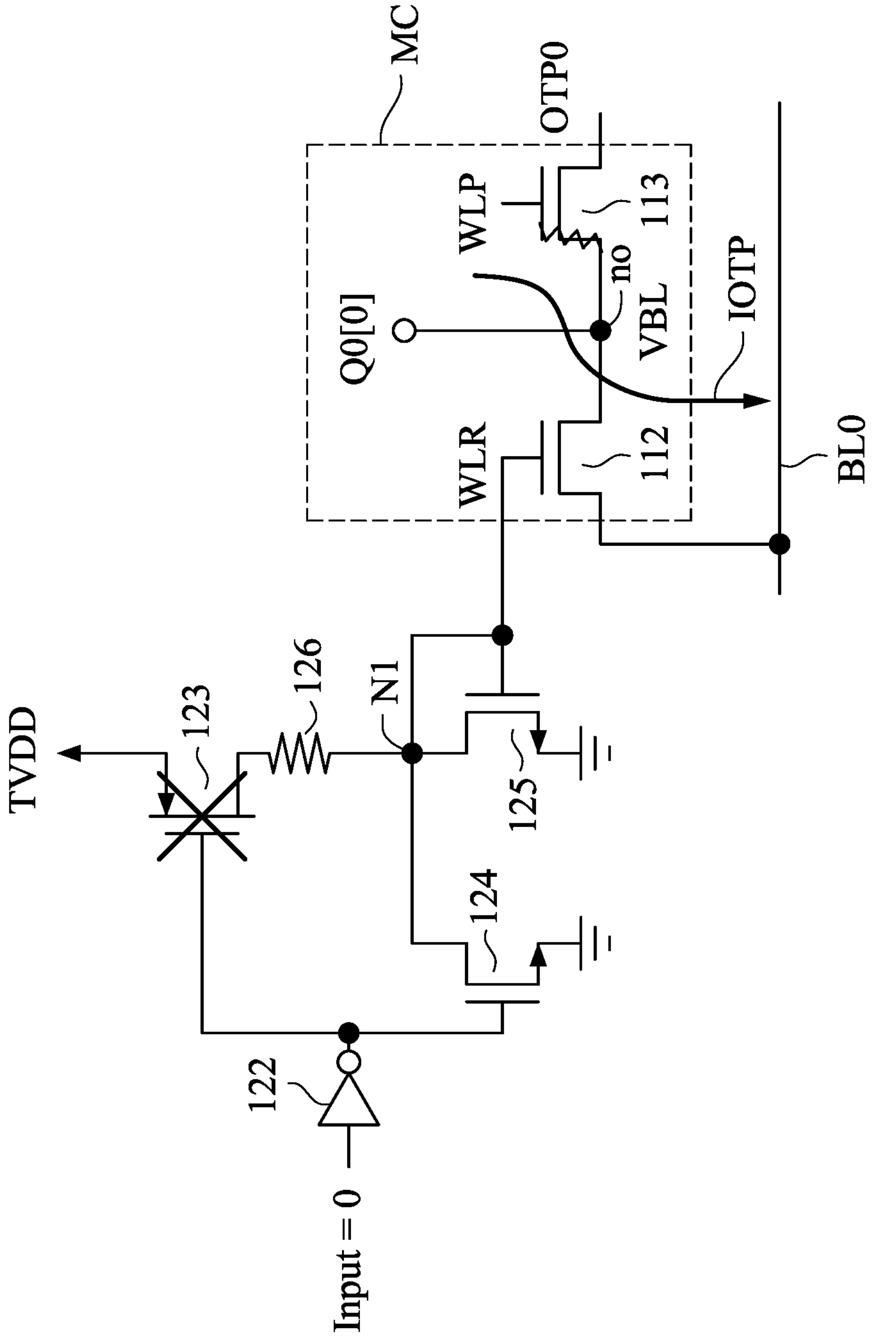

Reference is now made to FIGS. 3, 6, and 7B together. As shown in FIG. 7B corresponding to case B in Table I, the input data X0 has the logic value "0" the transistor 113 has a memory state OTP0 of the high resistance Rprogrammed, for example, around 1BΩ. In some embodiments, the memory state OTP0 refers to that the transistor 113 stores a bit value of "1."

In operation 31, it is similar to the configurations of the embodiments in FIG. 7A. As the transistor 112 does not conduct in response to the ground potential at the node N1, the current IOTP equals to 0 A and a value of the voltage VQ is around the voltage V1 represented as below according to equation (2):

$$VQ = VWLP - 0 \times 10^9 = 1 - 0 = 1$$

in which the voltage VWLP is around 1 Volt and the voltage VQ is around 1 Volt. The result of the CIM operation in case B equals to the bit value of "0."

Figure 7C:
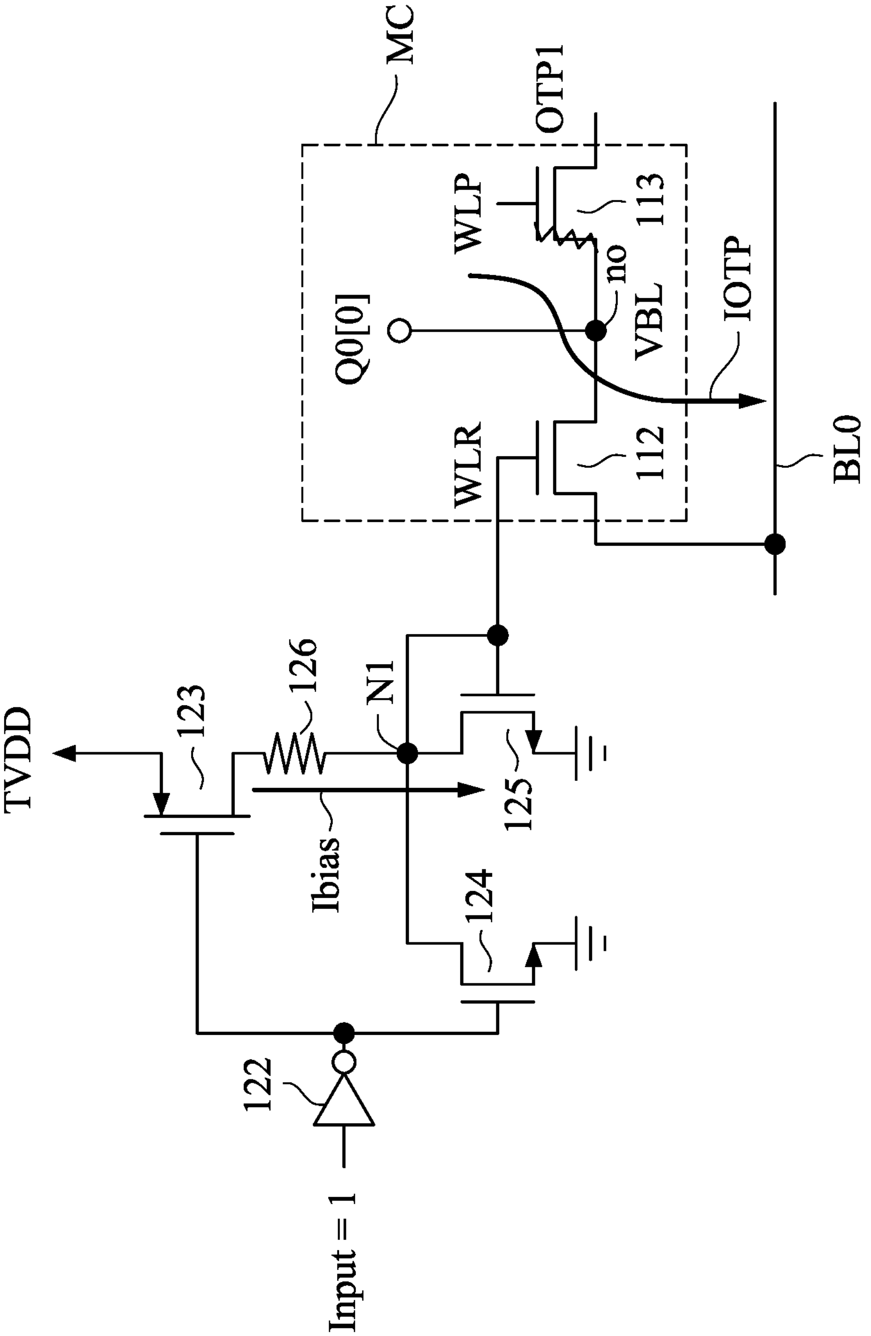

Reference is now made to FIGS. 3, 6, and 7C together. As shown in FIG. 7C corresponding to case C in Table I, the input data X0 has the logic value "1" the transistor 113 has the memory state OTP1 of the low resistance Runprogrammed corresponding to the bit value of "0."

In operation 32, the configurations of the bias circuit 1210 in FIG. 7C are similar to that in FIG. 5C. Hence, the repetitious descriptions are omitted here.

As shown in FIG. 7C, the transistor 125 in the bias circuit 121 and the transistor 112 form a current mirror. Accordingly, the transistor 112 is turned on in response to the voltage at the node N1 and the current IOTP, equal to the current Ibias, flows to the bit line BL0 through the transistors 112-113. Alternatively stated, the current mirror of the transistors 112 and 125 generates the current IOTP that flows through the transistor 111 and is replicated from the current Ibias flowing through the transistor 125. The current Ibias is around 1 nA, and accordingly, the value of the voltage VQ remains around the voltage V1 represented as below according to equation (2):

$$VQ = VWLP - IOTP \times ROTP = VWLP - Ibias \times ROTP = 1 - 1nu \times 5 \times 1000 \cong 1$$

in which the voltage VWLP is around 1 Volt and the voltage VQ is around 1 Volt. In some embodiments, the result of the CIM operation in case C equals to the bit value of "0."

Figure 7D:
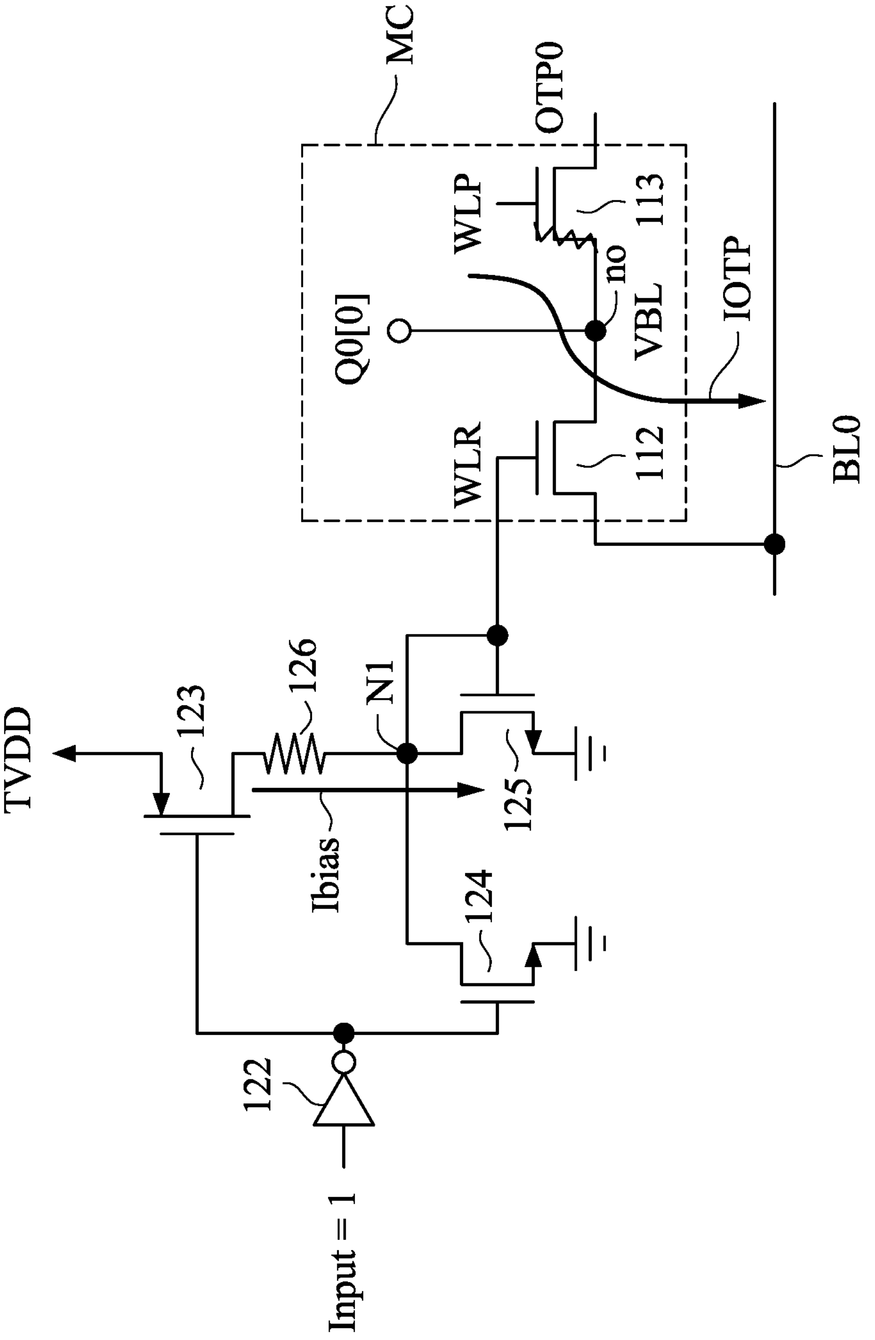

Reference is now made to FIGS. 3, 6, and 7D together. As shown in FIG. 7D corresponding to case D in Table I, the input data X0 has the logic value "1" the transistor 113 has the memory state OTP0 of the high resistance Rprogrammed corresponding to the bit value of "1."

In operation 33, the configurations of the bias circuit 1210 in FIG. 7D are similar to that in FIG. 5D. Hence, the repetitious descriptions are omitted here.

As shown in FIG. 7D, the transistor 112 is turned on in response to the voltage at the node N1 and the current IOTP, equal to the current Ibias, flows to the bit line BL0 through the transistors 112-113. The current Ibias is around 1 nA, and accordingly, the value of the voltage VQ is around the voltage V2 represented as below according to equation (2):

$$VQ = VWLP - IOTP \times ROTP = VWLP - Ibias \times ROTP = 1 - 1nu \times 10^9 = 0$$

in which the voltage VWLP is around 1 Volt and the voltage VQ is around 0 Volts. In some embodiments, the result of the CIM operation in case D equals to the bit value of "1."

The configurations of FIGS. 6-7D are given for illustrative purposes. Various implements are within the contemplated scope of the present disclosure. For example, in some embodiments, the voltage VWLP is associated with the high and low resistances of the transistor 113, so that the voltage VQ, indicating the result of the CIM operation, has the voltages V1 and V2 that are significantly different from each other. In some embodiments, the voltage V2 is around the ground potential.

Figure 8:
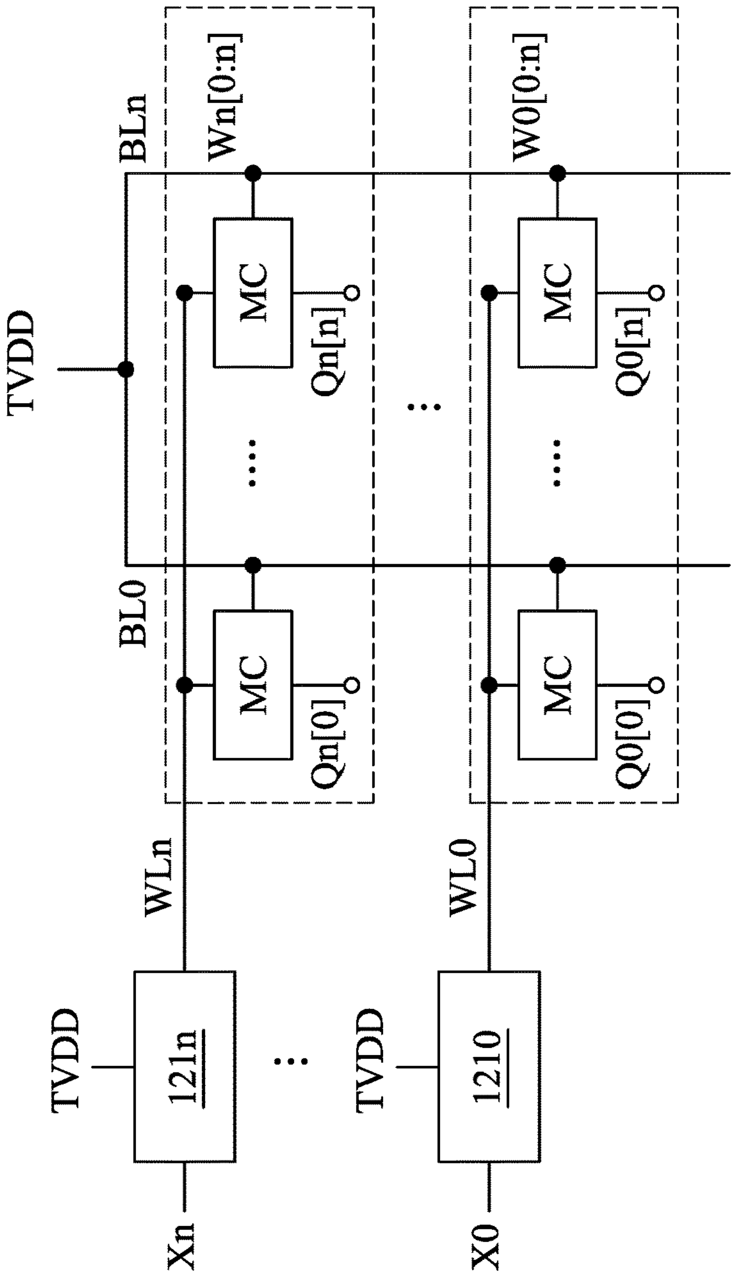
FIG. 8 is a schematic diagram of a memory device, in accordance with some embodiments of the present disclosure.

Reference is now made to FIG. 8. FIG. 8 is a schematic diagram of a memory device 80, in accordance with some embodiments of the present disclosure. With respect to the embodiments of FIGS. 1-7D, like elements in FIG. 8 are designated with the same reference numbers for ease of understanding. In some embodiments, the memory device 80 is configured with respect to, for example, the memory device 10 of FIG. 2.

Compared with FIG. 2, instead of having the voltage generating circuit 150 to provide the voltage according to the reference voltage Vref, the bit lines BL0-BLn of the memory device 80 are coupled to the voltage terminal TVDD and receive the supply voltage VDD.

Figure 9:
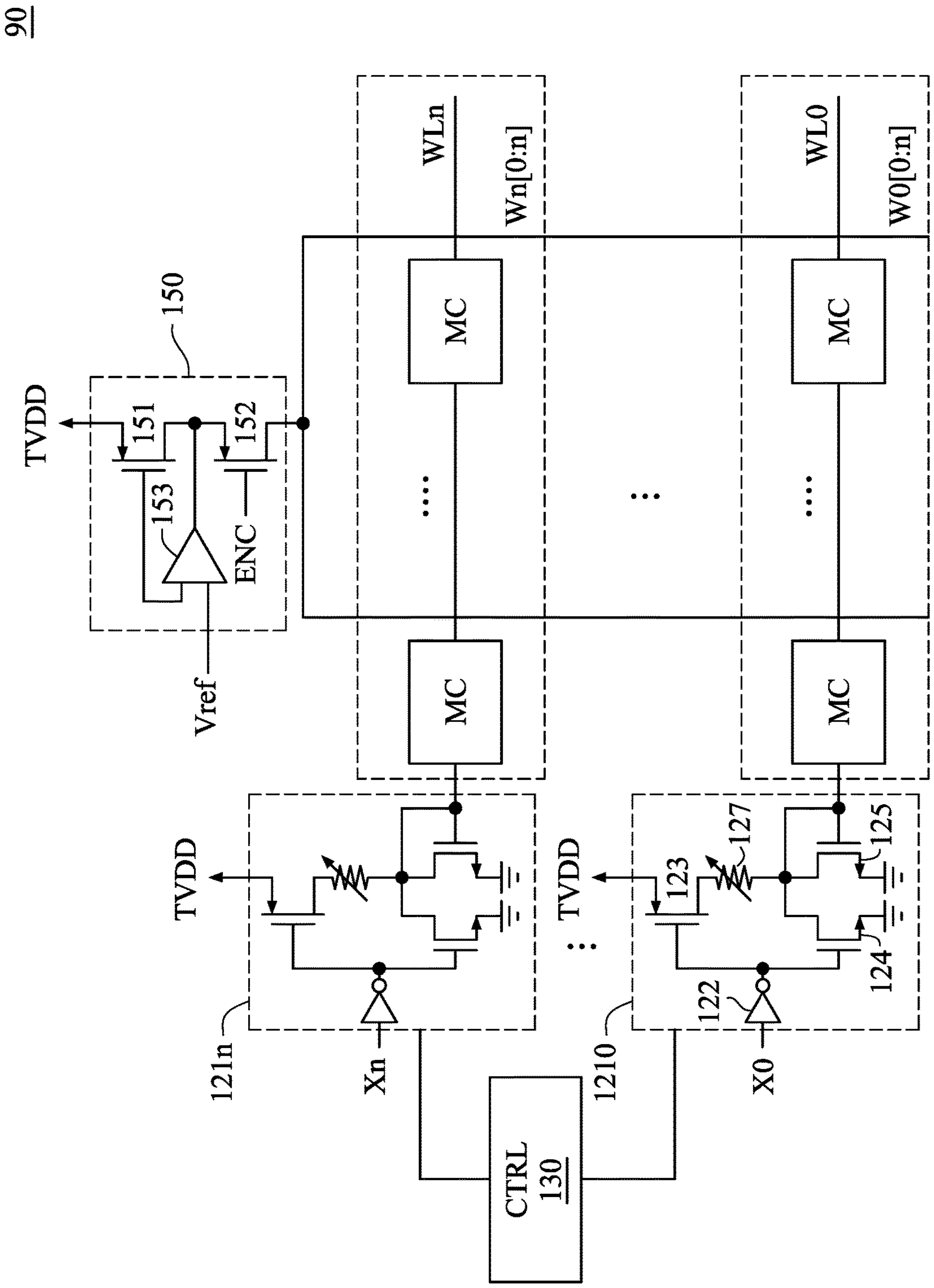
FIG. 9 is a schematic diagram of a memory device, in accordance with some embodiments of the present disclosure.

Reference is now made to FIG. 9. FIG. 9 is a schematic diagram of a memory device 90, in accordance with some embodiments of the present disclosure. In some embodiments, the memory device 90 is configured with respect to, for example, the memory device 10 of FIG. 2.

Compared with the embodiments in FIGS. 2, 4, and 6, instead of having the resistive unit 126, the bias circuits 1210-121*n* include tunable resistive units 127. In some embodiments, the resistance of the tunable resistive unit 127 is associated with the voltage VBL on the bit lines BL0-BLn (e.g., accordingly related to the reference voltage Vref) and high and low resistances of the fuse and the transistor 113.

Specifically, in some embodiments of FIG. 9, the memory cells MC are implemented by the fuse memory as shown in FIGS. 4-5D, and the output voltage VQ is associated with the voltage VBL and the current Ibias flowing through the resistive unit 127 in the CIM operation. For the purpose of the voltage VQ having distinguishably different voltages for different results of the CIM operation (as shown in table I and equation (1)), when the voltage VBL changes, the resistance of the tunable resistive unit 127 changes correspondingly. For example, according to some embodiments, the memory device 90 utilizes different reference voltages Vref in different operational modes to generate different voltage VBL. Accordingly, the control circuit 130 is further configured to generate control signals according to the reference voltage Vref, and the tunable resistive unit 127 is configured to have a desired resistance in response to the control signal from the control circuit 130.

According to some embodiments, in the first operational mode of the memory device 90 that requires less power consumption in the CIM operation, the tunable resistive unit 127 is controlled to have a resistance R1 when the reference voltage Vref has a voltage Vref1 and the voltage generating circuit 150 generates the voltage VBL has a voltage VBL1. Accordingly, with reference to equation (1) and the table I, when the input data X equal to "1" and the fuse has the low resistance Runprogrammed, a product of the current Ibias flowing through the tunable resistive unit 127 and the resistance of the fuse approximately equals to the ground voltage. In contrast, when the input data X equal to "1" and the fuse has the high resistance Rprogrammed, a product of the current Ibias flowing through the tunable resistive unit 127 and the resistance of the fuse approximately equals to the voltage VBL1.

In the second operational mode of the memory device 90 that requires high voltages in the CIM operation, the tunable resistive unit 127 is controlled to have a resistance R2, the reference voltage Vref has a voltage Vref2, and the voltage generating circuit 150 generates the voltage VBL has a voltage VBL2. Accordingly, with reference to equation (1) and the table I, when the input data X equal to "1" and the fuse has the low resistance Runprogrammed, a product of the current Ibias flowing through the tunable resistive unit 127 and the resistance of the fuse approximately equals to the ground voltage. In contrast, when the input data X equal to "1" and the fuse has the high resistance Rprogrammed, a product of the current Ibias flowing through the tunable resistive unit 127 and the resistance of the fuse approximately equals to the voltage VBL1.

In some embodiments, the voltage Vref1 is smaller than the voltage Vref2, and the voltage VBL1 is smaller than the voltage VBL2. The resistance R1 is greater than the resistance R2.

Also disclosed is a memory device. The memory device includes a non-volatile memory array including multiple memory cells, in which the memory cells arranged in a same row are configured to store corresponding weight data and are coupled to a same word line in multiple word lines; a word line driver configured to transmit multiple word line signals according to multiple input data signals to the word lines to perform a compute-in-memory (CIM) operation of the input data signals and the weight data stored in the non-volatile memory array; and an adder tree circuit coupled to the memory cells. Each of the memory cells in the same row is configured to generate a corresponding output voltage of the CIM operation to the adder tree circuit.

In some embodiments, the memory cells arranged in a same column are coupled to a same data line in multiple data lines. The memory cells in different columns are configured to operate in response to a voltage on the data lines in the CIM operation.

In some embodiments, each of the memory cells includes a transistor having a control terminal coupled to a corresponding one in the word lines and a first terminal coupled to a ground; and a fuse coupled between a second terminal of the transistor and a corresponding one in the data lines. Each of the memory cells is configured to output the output voltage at the second terminal of the transistor.

In some embodiments, the output voltage is associated with a voltage at the corresponding data line, a current flowing through the fuse and the transistor, and a resistance of the fuse.

In some embodiments, the word line driver includes multiple bias circuits each including an inverter configured to receive a corresponding one of the input data signals; a first transistor having a control terminal coupled to an output of the inverter and a first terminal coupled to a supply voltage terminal; a second transistor having a control terminal coupled to the output of the inverter and a first terminal coupled to a ground; a resistive unit coupled between a second terminal of the first transistor and a second terminal of the second transistor; and a third transistor having a first terminal coupled to the ground, wherein a control terminal and a second terminal of the third transistor is coupled to the second terminal of the second transistor and a corresponding word line at a first node.

In some embodiments, each of the memory cells includes a memory unit; and a fourth transistor coupled in series with the memory unit, in which a control terminal of the fourth transistor is coupled to the first node. The first, third, and fourth transistors are configured to be turned on to generate the output voltage at a second node between the memory unit and the fourth transistor to have a first voltage when the memory unit is unprogrammed to store a bit, equal to a first value, of the weight data and to generate the output voltage having a second voltage when the memory unit is programmed to store a bit, equal to a second value, of the weight data.

In some embodiments, the first transistor is turned off and the second transistor is turned on to generate the output voltage having the first voltage when the input data signal has a low logic state.

In some embodiments, the memory cells are coupled to multiple data lines. The memory device further includes a voltage generating circuit configured to transmit, in response to a reference voltage and a control signal, a data line voltage to the data lines in the CIM operation. The output voltage corresponds to the data line voltage minus a voltage across the memory unit.

In some embodiments, the memory unit has a first terminal being floating, a second terminal coupled to the second node, and a third terminal receiving a word line voltage. The output voltage corresponds to a voltage difference between the word line voltage and a voltage across the memory unit.

In some embodiments, the first transistor is of a first conductivity type, and the second to fourth transistors are of a second conductivity type different from the first conductivity type.

In some embodiments, the adder tree circuit is configured to perform an addition operation to the output voltages from each of the memory cells to generate a result of the CIM operation.

Also disclosed is a memory device. The memory device includes a word line driver including a bias circuit including a first transistor having a control terminal coupled to a word line; and a memory cell including a second transistor and a memory unit that are coupled in series between to a data line, wherein the first transistor and the second transistor form a current mirror. The bias circuit is configured to generate, in response to an input data signal for a compute-in-memory (CIM) operation, a first current flowing through the first transistor for the memory cell to generate a second current according to a memory state of the memory unit, wherein the memory state indicate a bit value of a weight data stored in the memory cell. The memory cell is configured to generate an output voltage of the CIM operation at an output terminal thereof.

In some embodiments, the memory unit is an electrical fuse (eFuse) unit.

In some embodiments, the memory unit is an one-time-programmable (OTP) memory.

In some embodiments, when the input data signal has a low logic value, the first current and the second current equal to zero and the output voltage equal to a voltage indicating a result of the CIM operation equal to a bit value of zero.

In some embodiments, when the input data signal has a high logic value, the output voltage equals to a difference between a voltage of the memory unit and a product of the second current and a resistance of the memory unit.

Also disclosed is a method of operating a memory device. The method includes: generating, in response to an input data having a first value, by a memory cell, an output voltage of a compute-in-memory (CIM) operation to have a first voltage when a first transistor of the memory cell is turned off by a bias circuit; generating, in response to the input data having a second value different from the first value, by the memory cell, the output voltage to have the first voltage when the first transistor of the memory cell is turned on by the bias circuit and a memory unit of the memory cell has a first memory state; and generating, in response to the input data having the second value, by the memory cell, the output voltage to have a second voltage different from the first voltage when the first transistor of the memory cell is turned on by the bias circuit and the memory unit has a second memory state different from the first memory state.

In some embodiments, a ratio between a resistance of the memory unit of the first memory state and a resistance of the memory unit of the second memory state is at least over $10^5$.

In some embodiments, the method further includes discharging a node coupled to a control terminal of the first transistor by turning one a second transistor in response to a first signal inverted from a second signal having the input data.

In some embodiments, generating, in response to the input data having the second value, by the memory cell, the output voltage to have the first voltage includes: generating a first current that flows through the first transistor and is replicated from a second current flowing through a second transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:

a non-volatile memory array comprising a plurality of memory cells, wherein the memory cells arranged in a same row are configured to store corresponding weight data and are coupled to a same word line in a plurality of word lines;

a word line driver configured to transmit a plurality of word line signals according to a plurality of input data signals to the plurality of word lines to perform a compute-in-memory (CIM) operation of the plurality of input data signals and the weight data stored in the non-volatile memory array;

a voltage generating circuit comprising series-coupled transistors that are configured to turn on in response to a reference voltage and a control signal, respectively, and configured to transmit a data line voltage to the memory cells in the CIM operation; and an adder tree circuit coupled to the plurality of memory cells, wherein each of the memory cells in the same row is configured to generate a corresponding output voltage of the CIM operation to the adder tree circuit.

2. The memory device of claim 1, wherein the memory cells arranged in a same column are coupled to a same data line in a plurality of data lines, wherein the memory cells in different columns are configured to operate in response to a voltage on the plurality of data lines in the CIM operation.

3. The memory device of claim 2, wherein each of the memory cells comprises:

a transistor having a control terminal coupled to a corresponding one in the plurality of word lines and a first terminal coupled to a ground; and a fuse coupled between a second terminal of the transistor and a corresponding one in the plurality of data lines, wherein each of the memory cells is configured to output the output voltage at the second terminal of the transistor.

4. The memory device of claim 3, wherein the output voltage is associated with a voltage at the corresponding data line, a current flowing through the fuse and the transistor, and a resistance of the fuse.

5. The memory device of claim 1, wherein the word line driver comprises:

a plurality of bias circuits comprising:

an inverter configured to receive a corresponding one of the input data signals;

a first transistor having a control terminal coupled to an output of the inverter and a first terminal coupled to a supply voltage terminal;

a second transistor having a control terminal coupled to the output of the inverter and a first terminal coupled to a ground;

a resistive unit coupled between a second terminal of the first transistor and a second terminal of the second transistor; and a third transistor having a first terminal coupled to the ground, wherein a control terminal and a second terminal of the third transistor is coupled to the second terminal of the second transistor and a corresponding word line at a first node.

6. The memory device of claim 5, wherein each of the memory cells comprises:

a memory unit; and a fourth transistor coupled in series with the memory unit, wherein a control terminal of the fourth transistor is coupled to the first node, wherein the first, third, and fourth transistors are configured to be turned on to generate the output voltage at a second node between the memory unit and the fourth transistor to have a first voltage when the memory unit is unprogrammed to store a bit, equal to a first value, of the weight data and the first, third, and fourth transistors are further configured to generate the output voltage having a second voltage when the memory unit is programmed to store a bit, equal to a second value, of the weight data.

7. The memory device of claim 6, wherein the first transistor is turned off and the second transistor is turned on to generate the output voltage having the first voltage when the input data signal has a low logic state.

8. The memory device of claim 6, wherein the memory cells are coupled to a plurality of data lines, wherein the output voltage corresponds to the data line voltage minus a voltage across the memory unit.

9. The memory device of claim 6, wherein the memory unit has a first terminal being floating, a second terminal coupled to the second node, and a third terminal receiving a word line voltage, wherein the output voltage corresponds to a voltage difference between the word line voltage and a voltage across the memory unit.

10. The memory device of claim 5, wherein the first transistor is of a first conductivity type, and the second to fourth transistors are of a second conductivity type different from the first conductivity type.

11. The memory device of claim 1, wherein the adder tree circuit is configured to perform an addition operation to the output voltages from each of the memory cells to generate a result of the CIM operation.

12. A memory device, comprising:

a word line driver comprising a bias circuit including a first transistor having a control terminal coupled to a word line; and a memory cell including a second transistor and a memory unit that are coupled in series between to a data line, wherein the first transistor and the second transistor form a current mirror;

wherein the bias circuit is configured to generate, in response to an input data signal for a compute-in-memory (CIM) operation, a first current flowing through the first transistor for the memory cell to generate a second current according to a memory state of the memory unit, wherein the memory state indicate a bit value of a weight data stored in the memory cell, wherein the memory cell is configured to generate an output voltage of the CIM operation at an output terminal thereof.

13. The memory device of claim 12, wherein the memory unit is an electrical fuse (eFuse) unit.

14. The memory device of claim 12, wherein the memory unit is an one-time-programmable (OTP) memory.

15. The memory device of claim 12, wherein when the input data signal has a low logic value, the first current and the second current equal to zero and the output voltage equal to a voltage indicating a result of the CIM operation equal to a bit value of zero.

16. The memory device of claim 12, wherein when the input data signal has a high logic value, the output voltage equals to a difference between a voltage of the memory unit and a product of the second current and a resistance of the memory unit.

17. A method, comprising:

generating, in response to an input data having a first value, by a memory cell, an output voltage of a compute-in-memory (CIM) operation to have a first voltage when a first transistor of the memory cell is turned off by a bias circuit;

generating, in response to the input data having a second value different from the first value, by the memory cell, the output voltage to have the first voltage when the first transistor of the memory cell is turned on by the bias circuit and a memory unit of the memory cell has a first memory state, and comprising:

generating a first current that flows through the first transistor and is replicated from a second current flowing through a second transistor in the bias circuit; and generating, in response to the input data having the second value, by the memory cell, the output voltage to have a second voltage different from the first voltage when the first transistor of the memory cell is turned on by the bias circuit and the memory unit has a second memory state different from the first memory state.

18. The method of claim 17, wherein a ratio between a resistance of the memory unit of the first memory state and a resistance of the memory unit of the second memory state is at least over $10^5$.

19. The method of claim 17, further comprising:

discharging a node coupled to a control terminal of the first transistor by turning a third transistor in response to a first signal inverted from a second signal having the input data.

20. The method of claim 19, further comprising:

turning off a fourth transistor having a control terminal receiving the first signal, a first terminal coupled to the node, and a second terminal coupled to a supply voltage terminal.

* * * * *